United States Patent
Pandey et al.

(10) Patent No.: US 11,935,946 B2
(45) Date of Patent: Mar. 19, 2024

(54) SILICON-CONTROLLED RECTIFIERS IN A SILICON-ON-INSULATOR TECHNOLOGY

(71) Applicant: GlobalFoundries U.S. Inc., Malta, NY (US)

(72) Inventors: Shesh Mani Pandey, Saratoga Springs, NY (US); Souvick Mitra, Essex Junction, VT (US); Anindya Nath, Essex Junction, VT (US)

(73) Assignee: GlobalFoundries U.S. Inc., Malta, NY (US)

(*) Notice: Subject to any disclaimer, the term of this patent is extended or adjusted under 35 U.S.C. 154(b) by 0 days.

(21) Appl. No.: 17/849,867

(22) Filed: Jun. 27, 2022

(65) Prior Publication Data

US 2023/0420551 A1 Dec. 28, 2023

(51) Int. Cl.
*H01L 29/745* (2006.01)
*H01L 29/66* (2006.01)

(52) U.S. Cl.
CPC .... *H01L 29/7455* (2013.01); *H01L 29/66363* (2013.01)

(58) Field of Classification Search
None
See application file for complete search history.

(56) References Cited

U.S. PATENT DOCUMENTS

| 5,923,067 A | 7/1999 | Voldman |
| 8,399,927 B2 | 3/2013 | Ding et al. |
| 2002/0037621 A1* | 3/2002 | Kawazoe ............ H01L 27/0262 438/296 |
| 2005/0236674 A1* | 10/2005 | Morishita .......... H01L 27/0262 257/361 |
| 2015/0194420 A1* | 7/2015 | Wang .................... H01L 29/861 257/133 |
| 2018/0138181 A1* | 5/2018 | El Dirani ............ H01L 29/0649 |
| 2019/0013310 A1* | 1/2019 | Paul .................... H01L 29/0834 |
| 2020/0357788 A1* | 11/2020 | De Conti ............ H01L 27/1207 |

OTHER PUBLICATIONS

A. Salman, M. Pelella, S. Beebe and N. Subba, "ESD protection for SOI technology using an under-the-box (substrate) diode structure," 2004 Electrical Overstress/Electrostatic Discharge Symposium, 2004, pp. 1-7, doi: 10.1109/EOSESD.2004.5272603.

* cited by examiner

*Primary Examiner* — Khaja Ahmad
(74) *Attorney, Agent, or Firm* — Thompson Hine LLP; Francois Pagette

(57) ABSTRACT

Structures for a silicon-controlled rectifier and methods of forming a structure for a silicon-controlled rectifier. The structure comprises a semiconductor substrate, a dielectric layer on the semiconductor substrate, and a first well and a second well in the semiconductor substrate beneath the dielectric layer. The first well has a first conductivity type, the second well has a second conductivity type opposite to the first conductivity type, and the second well adjoins the first well along a p-n junction. The structure further comprises a first terminal and a second terminal above the dielectric layer, a first connection extending through the dielectric layer from the first terminal to the first well, and a second connection extending through the dielectric layer from the second terminal to the second well.

20 Claims, 4 Drawing Sheets

SILICON-CONTROLLED RECTIFIERS IN A SILICON-ON-INSULATOR TECHNOLOGY

BACKGROUND

The disclosure relates generally to semiconductor devices and integrated circuit fabrication and, more specifically, to structures for a silicon-controlled rectifier and methods of forming a structure for a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed toward the integrated circuit. An ESD event may occur during post-manufacture chip handling or after chip installation on a circuit board or other carrier. An ESD event may originate from a variety of sources, such as the human body, a machine component, or a chip carrier.

Precautions may be taken to protect the integrated circuit from an ESD event. One such precaution is an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

A common type of protection device deployed in an ESD protection circuit is a silicon-controlled rectifier (SCR). In its quiescent high-impedance state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped in its low-impedance state to conduct the forward current so long as the forward current remains above another engineered threshold, known as the holding current. When the forward current from the ESD event drops below the holding current, the SCR returns to its quiescent high-impedance state.

Improved structures for a silicon-controlled rectifier and methods of forming a structure for a silicon-controlled rectifier are needed.

SUMMARY

In an embodiment, a structure for a silicon-controlled rectifier is provided. The structure comprises a semiconductor substrate, a dielectric layer on the semiconductor substrate, and a first well and a second well in the semiconductor substrate beneath the dielectric layer. The first well has a first conductivity type, the second well has a second conductivity type opposite to the first conductivity type, and the second well adjoins the first well along a p-n junction. The structure further comprises a first terminal and a second terminal above the dielectric layer, a first connection extending through the dielectric layer from the first terminal to the first well, and a second connection extending through the dielectric layer from the second terminal to the second well.

In an embodiment, a method of forming a structure for a silicon-controlled rectifier is provided. The method comprises forming a first well and a second well in a semiconductor substrate beneath a dielectric layer on the semiconductor substrate. The first well has a first conductivity type, the second well has a second conductivity type opposite to the first conductivity type, and the second well adjoins the first well along a p-n junction. The method further comprises forming a first terminal and a second terminal above the dielectric layer. The first terminal is coupled to the first well by a first connection extending from the first terminal through the dielectric layer to the first well, and the second terminal is coupled to the second well by a second connection extending from the second terminal through the dielectric layer to the second well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
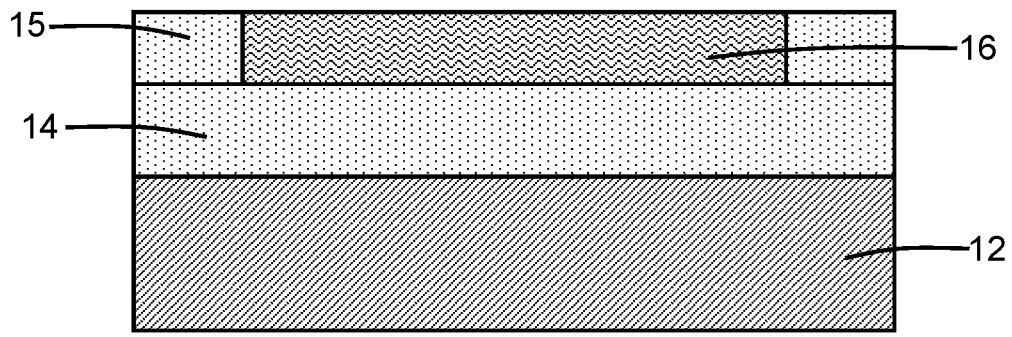
FIGS. 1-6 are cross-sectional views of a structure at successive fabrication stages of a processing method in accordance with embodiments of the invention.

With reference to FIG. 1 and in accordance with embodiments of the invention, a structure 10 for a silicon-controlled rectifier is formed using a semiconductor substrate 12, a dielectric layer 14, and a semiconductor layer 16 that is separated from the semiconductor substrate 12 by the dielectric layer 14. The semiconductor substrate 12 may be comprised of a semiconductor material, such as single-crystal silicon. The dielectric layer 14 may be comprised of a dielectric material, such as silicon dioxide, that is an electrical insulator. The semiconductor layer 16 may be comprised of a semiconductor material, such as single-crystal silicon. The dielectric layer 14 has an upper interface with the semiconductor layer 16, the dielectric layer 14 has a lower interface with the semiconductor substrate 12, and the upper and lower interfaces are separated by the thickness of the dielectric layer 14. In an embodiment, the semiconductor substrate 12, the dielectric layer 14, and the semiconductor layer 16 may be integrated into a silicon-on-insulator (SOI) substrate.

Shallow trench isolation regions 15 may be formed by patterning shallow trenches in the semiconductor layer 16 that extend to the dielectric layer 14, depositing a dielectric material, such as silicon dioxide, to fill the shallow trenches, and planarizing and/or recessing the deposited dielectric material. The shallow trench isolation regions 15 surround a portion of the semiconductor layer 16 used during the formation of the structure 10.

Figure 2:
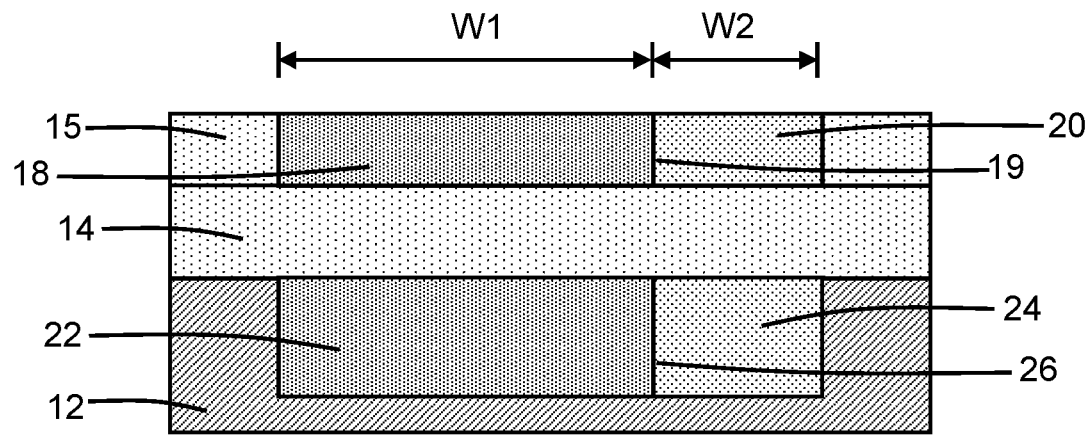

With reference to FIG. 2 in which like reference numerals refer to like features in FIG. 1 and at a subsequent fabrication stage, doped sections 18, 20 may be formed in the semiconductor layer 16, and wells 22, 24 may be formed in the semiconductor substrate 12. The wells 22, 24 are located in the semiconductor substrate 12 beneath (i.e., below) the dielectric layer 14 and are positioned adjacent to the dielectric layer 14 in a vertical direction. In an embodiment, the wells 22, 24 may adjoin the dielectric layer 14 at the lower interface with the semiconductor substrate 12. The doped section 20 and well 24 are doped to have an opposite conductivity type from the doped section 18 and well 22. The well 22 may adjoin the well 24 along an interface 26 across which the conductivity type changes to define a p-n junction, and the doped sections 18, 20 may adjoin along an interface 19 across which the conductivity type changes. In an embodiment, the well 22 may have a width W1 that is greater than a width W2 of the well 24.

The well 22 may be formed by introducing a dopant by, for example, ion implantation into the semiconductor substrate 12. A patterned implantation mask may be formed on the top surface of the semiconductor layer 16 to define a selected area that is exposed for implantation. The implantation mask may include a layer of an organic photoresist that is applied and patterned to form an opening exposing the selected area on the top surface of the semiconductor layer 16 and determining, at least in part, the location and horizontal dimensions of the well 22 in the semiconductor substrate 12. The implantation mask has a thickness and stopping power sufficient to block implantation in masked areas. The implantation conditions (e.g., ion species, dose, kinetic energy) may be selected to tune the electrical and physical characteristics of the well 22. In an embodiment, the well 22 may be doped with a concentration of an n-type dopant (e.g., arsenic or phosphorus) to provide n-type conductivity. The doped section 18 of the semiconductor layer 16 may be concurrently formed when the well 22 is formed, and the doped section 18 may be coextensive with one or more of the shallow trench isolation regions 15.

The well 24 may be formed by introducing a dopant by, for example, ion implantation into the semiconductor substrate 12. A patterned implantation mask may be formed on the top surface of the semiconductor layer 16 to define a selected area that is exposed for implantation. The implantation mask may include a layer of an organic photoresist that is applied and patterned to form an opening exposing the selected area on the top surface of the semiconductor layer 16 and determining, at least in part, the location and horizontal dimensions of the well 24 in the semiconductor substrate 12. The implantation mask has a thickness and stopping power sufficient to block implantation in masked areas. The implantation conditions (e.g., ion species, dose, kinetic energy) may be selected to tune the electrical and physical characteristics of the well 24. In an embodiment, the well 24 may be doped with a concentration of a p-type dopant (e.g., boron) to provide p-type conductivity. The doped section 20 of the semiconductor layer 16 may be concurrently formed when the well 24 is formed, and the doped section 20 may be coextensive with one or more of the shallow trench isolation regions 15.

Figure 3:
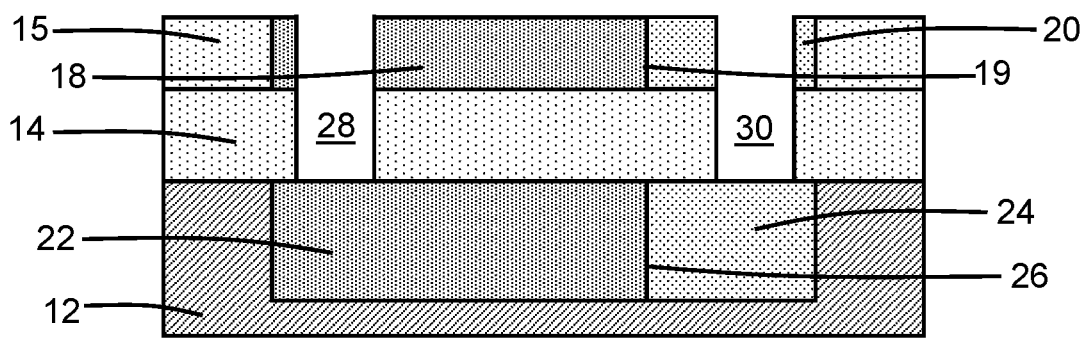

With reference to FIG. 3 in which like reference numerals refer to like features in FIG. 2 and at a subsequent fabrication stage, trenches 28, 30 are formed by lithography and etching processes that penetrate through the dielectric layer 14 and the semiconductor layer 16 to the semiconductor substrate 12. The trench 28 is spaced in a lateral direction from the trench 30, and the trenches 28, 30 may have a parallel alignment and be disconnected from each other. The trench 28 extends through the doped section 18 of the semiconductor layer 16 and the dielectric layer 14 to intersect a portion of the well 22 in the semiconductor substrate 12. The trench 30 extends through the doped section 20 of the semiconductor layer 16 and the dielectric layer 14 to intersect a portion of the well 24 in the semiconductor substrate 12. In an embodiment, the bottoms of the trenches 28, 30 may be coplanar with the lower interface between the semiconductor substrate 12 and the dielectric layer 14. The trenches 28, 30 are spaced inward from the shallow trench isolation regions 15 and, in that regard, the trenches 28, 30 have a non-overlapping relationship with the shallow trench isolation regions 15. The trenches 28, 30 are spaced outward from the interface 19 between the doped sections 18, 20 and the interface 26 between the wells 22, 24.

Figure 4:
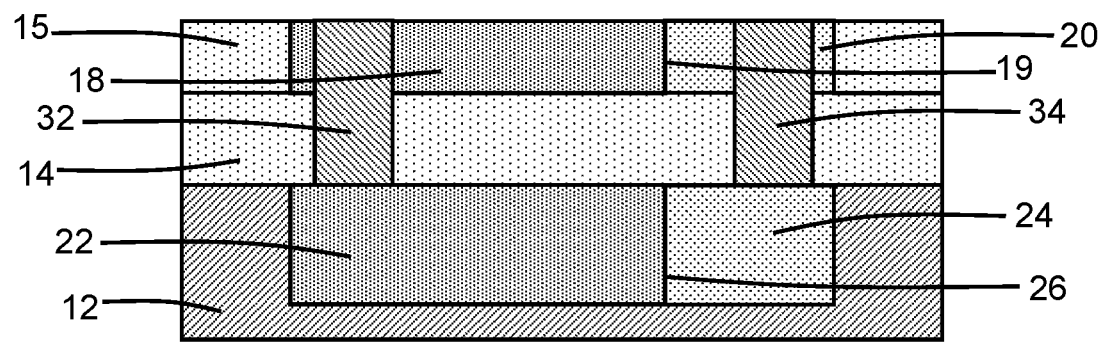

With reference to FIG. 4 in which like reference numerals refer to like features in FIG. 3 and at a subsequent fabrication stage, semiconductor layers 32, 34 are respectively formed in the trenches 28, 30. In an embodiment, the semiconductor layers 32, 34 may be formed by depositing a layer of material, such as polysilicon, inside the trenches 28, 30 and planarizing the deposited layer by chemical-mechanical polishing. In an alternative embodiment, the semiconductor layers 32, 34 may be formed by epitaxially growing a layer of material, such as single-crystal silicon, inside the trenches 28, 30. In an embodiment, the semiconductor layers 32, 34 may contain a p-type dopant, such as boron, introduced during deposition or growth. In an embodiment, the semiconductor layers 32, 34 may contain an n-type dopant, such as arsenic or phosphorus, introduced during deposition or growth.

In an alternative embodiment, the wells 22, 24 may be formed after the trenches 28, are formed and filled by the semiconductor layers 32, 34.

Figure 5:
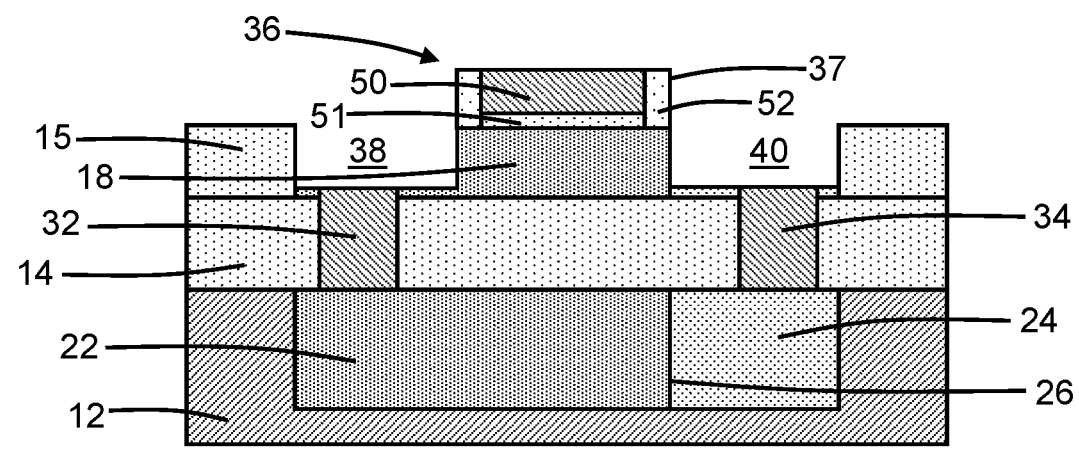

With reference to FIG. 5 in which like reference numerals refer to like features in FIG. 4 and at a subsequent fabrication stage, an alignment structure 36 may be formed on the top surface of the semiconductor layer 16. In an embodiment, the alignment structure 36 may overlap with a portion the doped section 18 of the semiconductor layer 16 that is adjacent to the doped section 20 of the semiconductor layer 16. In an embodiment, the alignment structure 36 may include a gate 50, a gate dielectric 51, and dielectric sidewall spacers 52 characteristic of a gate structure of a planar field-effect transistor. The gate 50 may be comprised of a conductor, such as doped polysilicon, the gate dielectric 51 may be comprised of a dielectric material, such as silicon dioxide, and the dielectric sidewall spacers 52 may be comprised of a dielectric material, such as silicon nitride, that is an electrical insulator. The alignment structure 36 may have a sidewall 37, and the sidewall 37 may be aligned with the interface 19 between the doped section 18 and the doped section 20 of the semiconductor layer 16, as well as aligned with the interface 26 between the wells 22, 24. In an embodiment, the sidewall 37 may be a side surface of one of the dielectric sidewall spacers 52.

A portion of the doped section 18 of the semiconductor layer 16, a portion of the doped section 20 of the semiconductor layer 16, and portions of the semiconductor layers 32, 34 may be etched by an etching process that is self-aligned to the alignment structure 36 and shallow trench isolation regions 15 to define trenches 38, 40. A portion of the doped section 18 of the semiconductor layer 16 is preserved during the etching process due to the protection provided by the alignment structure 36 and retains the full original thickness. The trenches 38, may penetrate partially through the semiconductor layer 16 such a thinned portion of the doped section 18 remains at the bottom of the trench 38 and a thinned portion of the doped section 20 remains at the bottom of the trench 40. In an embodiment, the formation of the trench may eliminate the interface 19 other than a portion of the interface 19 remaining between the thinned portion of the doped section 20 and the adjacent preserved portion of the doped section 18. The semiconductor layers 32, 34 include top surfaces that are revealed within the trenches 38, 40 at the trench bottoms. In an embodiment, the top surfaces of the semiconductor layers 32, 34 may be coplanar with the thinned portions of the doped sections 18, 20. In an alternative embodiment, the trenches 38, 40 may extend in depth to the top surface of the dielectric layer 14 such that the thinned portions of the doped sections 18, 20 are absent.

Figure 6:
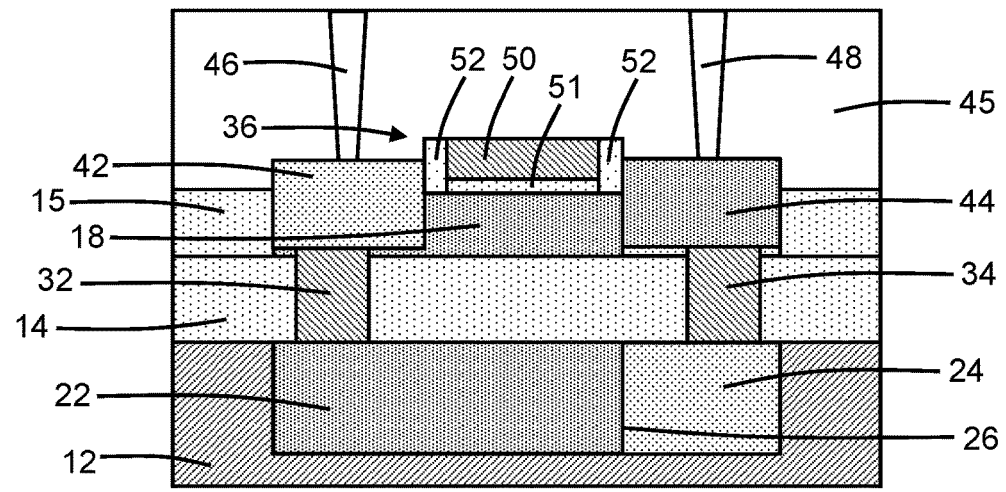

With reference to FIG. 6 in which like reference numerals refer to like features in FIG. 5 and at a subsequent fabrication stage, semiconductor layers 42, 44 are formed adjacent to the opposite sides of the alignment structure 36 and over (i.e., above) the dielectric layer 14. The semiconductor layers 42, 44 may provide terminals (i.e., an anode and a cathode) of the silicon-controlled rectifier. The semiconductor layers 42, 44 may be comprised of a semiconductor material, such as single-crystal silicon. The semiconductor layer 42 has an opposite conductivity type from the well 22, and the semiconductor layer 44 has an opposite conductivity type from the well 24. In an embodiment, the semiconductor layer 42 may be doped (e.g., heavily doped) with a concentration of a dopant, such as a p-type dopant (e.g., boron) to provide p-type conductivity, and the semiconductor layer 44 may be doped (e.g., heavily doped) with a concentration of a dopant, such as an n-type dopant (e.g., phosphorus or arsenic) to provide n-type conductivity.

The semiconductor layer 42 and the semiconductor layer 44 may be formed by separate epitaxial growth processes and may be doped during epitaxial growth. The semiconductor layer 42 may be epitaxially grown inside the trench 38 from the thinned portion of the doped section 18 of the semiconductor layer 16 and the top surface of the semiconductor layer 32 at the bottom of the trench 38. The semiconductor layer 44 may be epitaxially grown inside the trench 40 from the thinned portion of the doped section 20 of the semiconductor layer 16 and the top surface of the semiconductor layer 34 at the bottom of the trench 40.

One of the dielectric sidewall spacers 52 is positioned in a lateral direction between the gate 50 and the semiconductor layer 42. Another of the dielectric sidewall spacers 52 is positioned in a lateral direction between the gate 50 and the semiconductor layer 44. The preserved portion of the doped section 18 of the semiconductor layer 16, which is disposed in a vertical direction between the alignment structure 36 and the dielectric layer 14, is positioned in a lateral direction between the semiconductor layer 42 and the semiconductor layer 44. The semiconductor layer 42 is doped to have an opposite conductivity type from the preserved portion of the doped section 18 of the semiconductor layer 16.

The semiconductor layer 42 is positioned in a vertical direction above the dielectric layer 14, and the well 22 is positioned in a vertical direction below the dielectric layer 14. The semiconductor layer 32 defines a connection in the form of a conductive pillar extending through the dielectric layer 14 from the semiconductor layer 42 to the well 22. The semiconductor layer 32 physically and electrically couples the semiconductor layer 42 to the well 22. In an embodiment, the connection provided by the semiconductor layer 32 may be a direct connection.

The semiconductor layer 44 is positioned in a vertical direction above the dielectric layer 14, and the well 24 is positioned in a vertical direction below the dielectric layer 14. The semiconductor layer 34 defines a connection in the form of a conductive pillar extending through the dielectric layer 14 from the semiconductor layer 44 to the well 24. The semiconductor layer 34 physically and electrically couples the semiconductor layer 44 to the well 24. In an embodiment, the connection provided by the semiconductor layer 34 may be a direct connection.

A p-n junction is defined in a vertical direction between the semiconductor layer 32 and either the semiconductor layer 42 or the well 22 contingent upon the conductivity type of the semiconductor layer 32. A p-n junction is also defined in a vertical direction between the semiconductor layer 34 and either the semiconductor layer 44 or the well 24 contingent upon the conductivity type of the semiconductor layer 34. The p-n junctions that include the semiconductor layers 32, 34 may be oriented in a lateral direction, whereas the interface 26 may be oriented in a vertical direction transverse to the lateral direction.

Middle-of-line processing and back-end-of-line processing follow, which includes formation of an interconnect structure with electrical connections coupled to the structure 10. In particular, a dielectric layer 45 is formed over the semiconductor layers 42, 44 and alignment structure 36, the terminal provided by the semiconductor layer 42 is physically and electrically coupled to a contact 46 formed in the dielectric layer 45, and the terminal provided by the semiconductor layer 44 is physically and electrically coupled to a contact 48 formed in the dielectric layer 45. The contacts 46, 48 may be comprised of a metal, such as tungsten, and the dielectric layer 45 may be comprised of a dielectric material, such as silicon dioxide. In an embodiment, the wells 22, 24 may also be physically and electrically coupled to contacts 47, 49 (FIG. 7), which are similar to contacts 46, 48, that are also formed in the dielectric layer 45. In an embodiment, the alignment structure 36 may be non-contacted within the interconnect structure.

The structure 10 may embody a device structure for a silicon-controlled rectifier, which may find use as an electrostatic discharge protection device. The structure 10 may be compact in design and may exhibit high performance in comparison with conventional silicon-controlled rectifiers. The semiconductor layers 32, 34 define respective connections extending through the dielectric layer 14 that permit the wells 22, 24 to be located on an opposite side of the dielectric layer 14 from the semiconductor layers 42, 44. As a result, different portions of the silicon-controlled rectifier are located on opposite sides of the dielectric layer 14 in a vertical direction.

Figure 7:
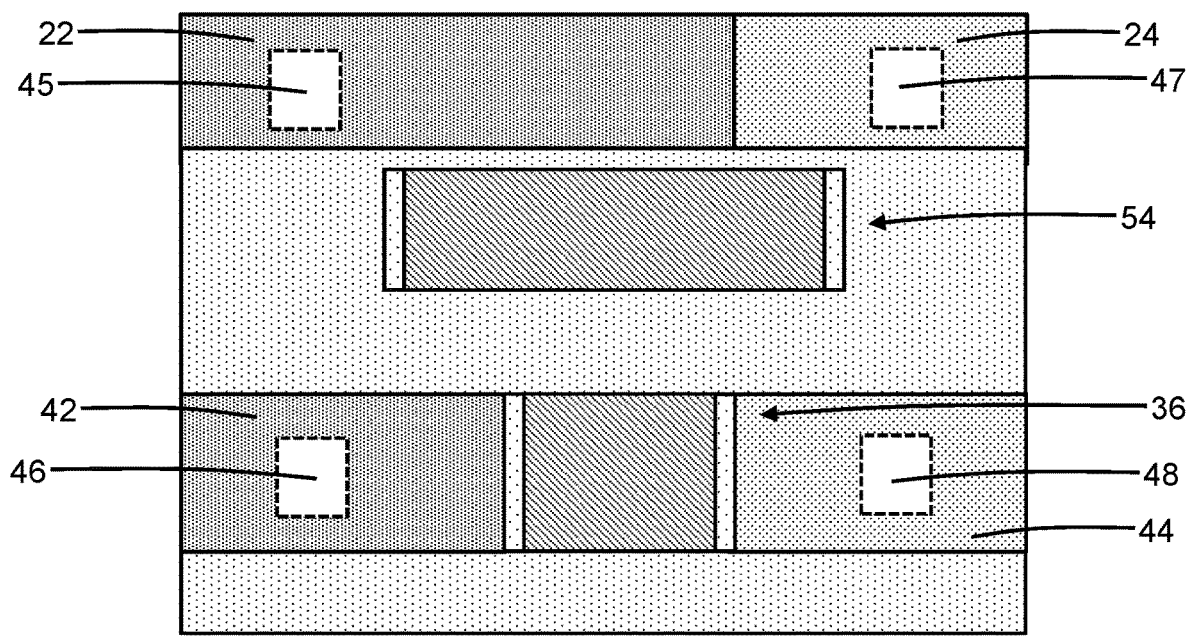
FIG. 7 is a diagrammatic top view of a layout for a structure in accordance with embodiments of the invention.

With reference to FIG. 7 and in accordance with alternative embodiments of the invention, the contacts 47, 49 that are physically and electrically coupled to the wells 22, 24 may be offset in a lateral direction from the contacts 46, 48 that are physically and electrically coupled to the semiconductor layers 42, 44. The lateral offset spaces the contacts 47, 49 from the contacts 46, 48. In an embodiment, a planar field-effect transistor 54 with a thick gate dielectric provided by the dielectric layer 14 may be formed that is coupled to the silicon-controlled rectifier in the interconnect structure and that may provide assistance with triggering the silicon-controlled rectifier. In an embodiment, one or more of the same processes used to form the alignment structure 36 may be used to form the gate structure of the planar field-effect transistor 54. The well 22 may include a heavily-doped region of the same conductivity type that facilitates the electrical connection between the contact 47 and the well 22. Similarly, the well 24 may include a heavily-doped region of the same conductivity type that facilitates the electrical connection between the contact 49 and the well 24.

Figure 8:
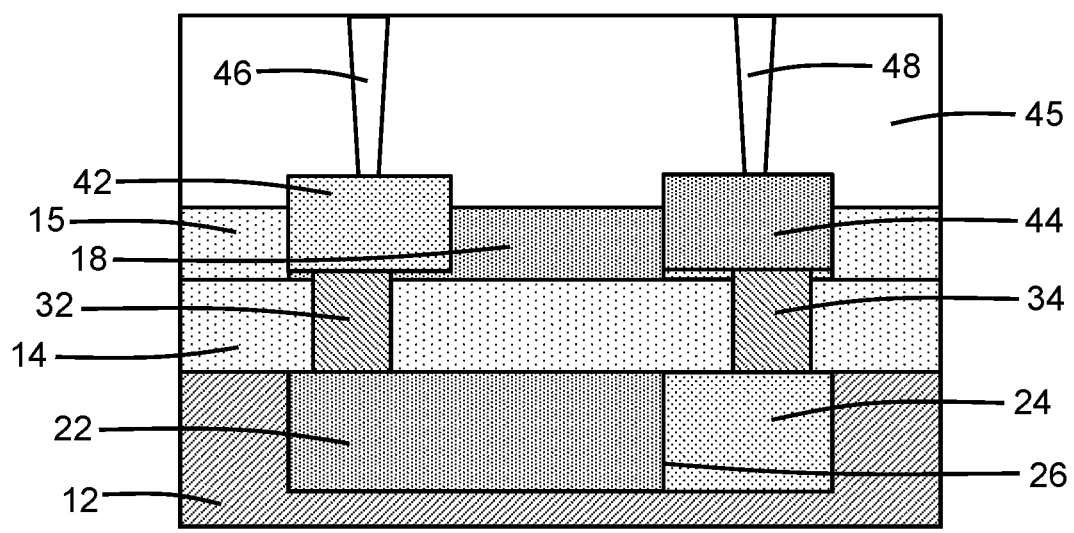
FIG. 8 is a cross-sectional view of a structure in accordance with alternative embodiments of the invention.

With reference to FIG. 8 and in accordance with alternative embodiments, the structure 10 may be formed without the alignment structure 36 on the top surface of the semiconductor layer 16. The semiconductor layers 42, 44 may be grown in the laterally spaced trenches 38, 40 by separate selective epitaxial growth processes.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a silicon-controlled rectifier, the structure comprising:
   a semiconductor substrate;
   a first dielectric layer on the semiconductor substrate, the first dielectric layer having a thickness;
   a first well in the semiconductor substrate beneath the first dielectric layer, the first well having a first conductivity type;
   a second well in the semiconductor substrate beneath the first dielectric layer, the second well having a second conductivity type opposite to the first conductivity type, and the second well adjoining the first well along a first p-n junction;
   a first terminal above the first dielectric layer;
   a second terminal above the first dielectric layer;
   a first connection having a first top surface above the first dielectric layer, the first connection extending from the first top surface through the thickness of the first dielectric layer between the first terminal and the first well; and
   a second connection having a second top surface above the first dielectric layer, the second connection extending from the second top surface through the thickness of the first dielectric layer between the second terminal and the second well.

2. The structure of claim 1 wherein the first connection is a first conductive pillar comprising a doped semiconductor material.

3. The structure of claim 2 wherein the second connection is a second conductive pillar comprising the doped semiconductor material.

4. The structure of claim 3 wherein the doped semiconductor material is doped polysilicon.

5. The structure of claim 3 wherein the doped semiconductor material is doped single-crystal silicon.

6. The structure of claim 3 wherein the first conductive pillar defines a second p-n junction with either the first terminal or the first well.

7. The structure of claim 6 wherein the second conductive pillar defines a third p-n junction with either the second terminal or the second well.

8. The structure of claim 1 wherein the first terminal comprises a first semiconductor layer doped to have the first conductivity type.

9. The structure of claim 8 wherein the second terminal comprises a second semiconductor layer doped to have the second conductivity type.

10. The structure of claim 9 further comprising:
    a second dielectric layer over the first semiconductor layer and the second semiconductor layer;
    a first contact in the second dielectric layer, the first contact coupled to the first semiconductor layer; and
    a second contact in the second dielectric layer, the second contact coupled to the second semiconductor layer.

11. The structure of claim 10 wherein the first contact and the second contact comprise a metal.

12. The structure of claim 11 further comprising:
    a third contact in the second dielectric layer, the third contact coupled to the first well; and
    a fourth contact in the second dielectric layer, the fourth contact coupled to the second well.

13. The structure of claim 12 wherein the third contact and the fourth contact are laterally offset from the first contact and the second contact.

14. The structure of claim 9 wherein the first p-n junction between the first well and the second well is laterally positioned in the semiconductor substrate between the first semiconductor layer and the second semiconductor layer.

15. The structure of claim 9 wherein the first semiconductor layer is positioned in a vertical direction relative to the first well, and the second semiconductor layer is positioned in the vertical direction relative to the second well.

16. The structure of claim 9 further comprising:
    an alignment structure positioned in a vertical direction over the first dielectric layer, the alignment structure positioned in a lateral direction between the first semiconductor layer and the second semiconductor layer.

17. The structure of claim 16 wherein the alignment structure comprises a gate, a first dielectric sidewall spacer positioned in the lateral direction between the gate and the first semiconductor layer, and a second dielectric sidewall spacer positioned in the lateral direction between the gate and the second semiconductor layer.

18. A method of forming a structure for a silicon-controlled rectifier, the method comprising:
forming a first well in a semiconductor substrate beneath a dielectric layer on the semiconductor substrate, wherein the first well has a first conductivity type;
forming a second well in the semiconductor substrate beneath the dielectric layer, wherein the second well has a second conductivity type opposite to the first conductivity type, and the second well adjoins the first well along a p-n junction;
forming a first terminal above the dielectric layer, wherein the first terminal is coupled to the first well by a first connection having a first top surface above the dielectric layer, and the first connection extends from the first top surface through a thickness of the dielectric layer between the first terminal and the first well; and
forming a second terminal above the dielectric layer, wherein the second terminal is coupled to the second well by a second connection having a second top surface above the dielectric layer, and the second connection extends from the second top surface through the thickness of the dielectric layer between the second terminal and the second well.

19. The method of claim 18 further comprising:
forming a first trench extending through the dielectric layer to the first well; and forming a first conductive pillar in the first trench,
wherein the first conductive pillar provides the first connection between the first terminal and the first well, and the first conductive pillar comprises a doped semiconductor material.

20. The method of claim 19 further comprising:
forming a second trench extending through the dielectric layer to the second well; and forming a second conductive pillar in the second trench,
wherein the second conductive pillar provides the second connection between the second terminal and the second well, and the second conductive pillar comprises the doped semiconductor material.

* * * * *